(12) United States Patent
Hori et al.

(10) Patent No.: US 11,459,670 B2
(45) Date of Patent: Oct. 4, 2022

(54) SILICON CARBIDE EPITAXIAL WAFER

(71) Applicant: SUMITOMO ELECTRIC INDUSTRIES, LTD., Osaka (JP)

(72) Inventors: Tsutomu Hori, Osaka (JP); Takaya Miyase, Osaka (JP); Tsubasa Honke, Osaka (JP); Hirofumi Yamamoto, Osaka (JP); Kyoko Okita, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 384 days.

(21) Appl. No.: 16/638,877

(22) PCT Filed: Aug. 28, 2018

(86) PCT No.: PCT/JP2018/031786
§ 371 (c)(1),
(2) Date: Feb. 13, 2020

(87) PCT Pub. No.: WO2019/044841
PCT Pub. Date: Mar. 7, 2019

(65) Prior Publication Data
US 2020/0362470 A1 Nov. 19, 2020

(30) Foreign Application Priority Data

Sep. 1, 2017 (WO) .................. PCT/JP2017/031668
Dec. 28, 2017 (WO) .................. PCT/JP2017/047289

(51) Int. Cl.
*H01L 29/16* (2006.01)
*C30B 29/36* (2006.01)
(Continued)

(52) U.S. Cl.
CPC .............. *C30B 29/36* (2013.01); *C30B 25/20* (2013.01); *C30B 29/68* (2013.01); *H01L 29/1608* (2013.01)

(58) Field of Classification Search
CPC ...... C30B 29/36; C30B 29/68; H01L 29/1608
See application file for complete search history.

(56) References Cited

U.S. PATENT DOCUMENTS 11,293,115 B2 * 4/2022 Guo .................. H01L 21/02634
2012/0280254 A1 11/2012 Muto et al.
(Continued)

FOREIGN PATENT DOCUMENTS

JP 2009-292705 12/2009
JP 2015-013761 1/2015
(Continued)

OTHER PUBLICATIONS

Tsuchida, H., et al., "Formation of basal plane Frank-type faults in 4H-SiC epitaxial growth", Journal of Crystal Growth, 2008, vol. 310, pp. 757-765, ISSN 0022-0248, in particular, abstract, 2., 3.2, 3.3, fig. 4-7.
(Continued)

*Primary Examiner* — Nicholas J Tobergte
(74) *Attorney, Agent, or Firm* — IPUSA, PLLC

(57) ABSTRACT

A silicon carbide epitaxial wafer includes a single crystal silicon carbide substrate of 4H polytype having a major surface thereof inclined at an angle θ to a {0001} plane toward a <11-20> direction, and a silicon carbide epitaxial layer of a thickness t formed on the major surface, wherein a diameter of the single crystal silicon carbide substrate is greater than or equal to 150 mm, wherein the angle θ exceeds 0°, and is less than or equal to 6°, wherein one or more pairs of a screw dislocation pit and a diagonal line defect situated at a distance of t/tanθ from the pit are present in a surface of the silicon carbide epitaxial layer, and wherein a density of the pairs of a pit and a diagonal line defect is less than or equal to 2 pairs/cm2.

9 Claims, 10 Drawing Sheets

(51) Int. Cl.
*C30B 25/20* (2006.01)
*C30B 29/68* (2006.01)

(56) References Cited

U.S. PATENT DOCUMENTS

| | | |
|---|---|---|
| 2016/0138186 A1 | 5/2016 | Hori et al. |
| 2016/0215414 A1* | 7/2016 | Nakabayashi ...... H01L 29/1608 |
| 2017/0067183 A1 | 3/2017 | Seki et al. |
| 2018/0363166 A1 | 12/2018 | Wada et al. |
| 2019/0177876 A1* | 6/2019 | Guo ........................ C30B 29/36 |

FOREIGN PATENT DOCUMENTS

| | | |
|---|---|---|
| JP | 2017-145150 | 8/2017 |
| WO | 2011/074453 | 6/2011 |
| WO | 2013/150587 | 10/2013 |
| WO | 2015/137439 | 9/2015 |
| WO | 2016/051485 | 4/2016 |

OTHER PUBLICATIONS

Berechman, R. A., et al., "Trapezoid defect in 4H-SiC epilayers", Journal of Crystal Growth, 2012, vol. 338, pp. 16-19, ISSN 0022-0248.

* cited by examiner

SILICON CARBIDE EPITAXIAL WAFER

TECHNICAL FIELD

The disclosures herein relate to a silicon carbide epitaxial wafer.

The present application claims priority to International Application PCT/JP2017/031668 filed under the Patent Cooperation Treaty on Sep. 1, 2017, and claims priority to International Application PCT/JP2017/047289 filed under Patent Cooperation Treaty on Dec. 28, 2017. All the contents of the noted international applications are incorporated herein by reference.

BACKGROUND ART

A silicon carbide epitaxial wafer that has a silicon carbide epitaxial layer grown on a single-crystal silicon carbide substrate disposed in a convex form and has few crystal defects is disclosed as an example of silicon carbide epitaxial wafers (see Patent Document 1, for example).

RELATED-ART DOCUMENTS

Patent Document

[Patent Document 1] Japanese Patent Application Publication No. 2009-292705

SUMMARY OF THE INVENTION

According to one aspect of a present embodiment, a silicon carbide epitaxial wafer includes a single crystal silicon carbide substrate of 4H polytype having a major surface thereof inclined at an angle $\theta$ to a {0001} plane toward a <11-20> direction, and a silicon carbide epitaxial layer of a thickness t formed on the major surface. The diameter of the single crystal silicon carbide substrate is greater than or equal to 150 mm, and the angle $\theta$ exceeds 0°, and is less than or equal to 6°. One or more pairs of a screw dislocation pit and a diagonal line defect situated at a distance of $t/\tan\theta$ from the pit are present in a surface of the silicon carbide epitaxial layer, and the density of the pairs of a pit and a diagonal line defect is less than or equal to 2 pairs/cm².

MODE FOR CARRYING OUT THE INVENTION

Figure 1:
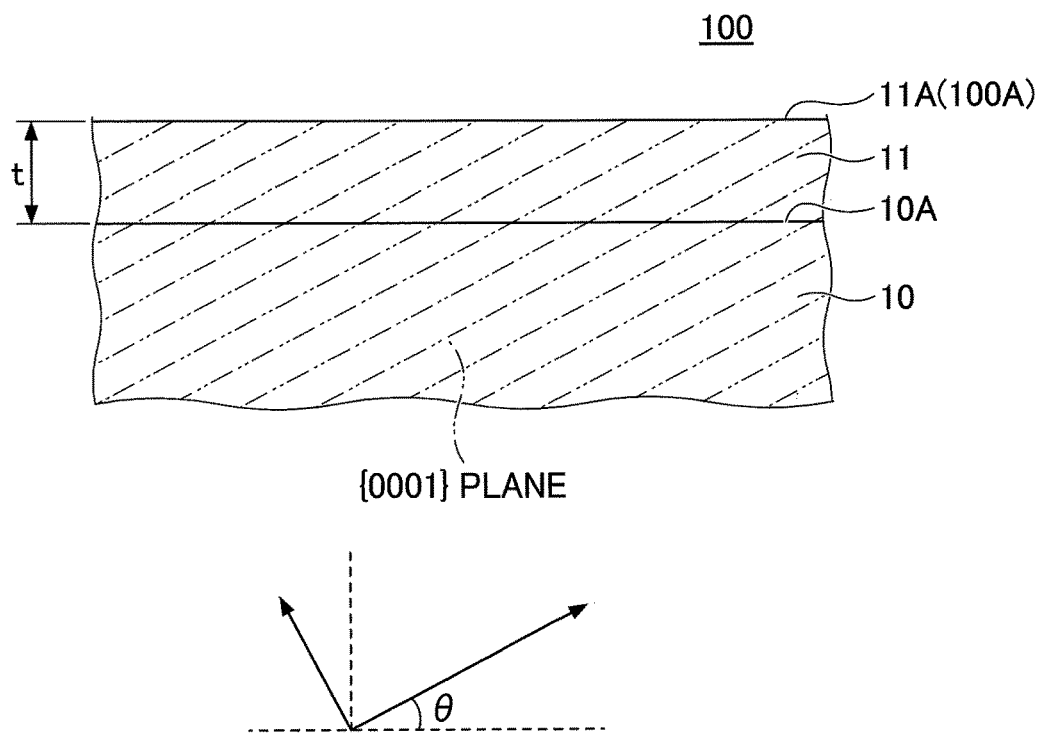
FIG. 1 is a partial cross-sectional view schematically illustrating a silicon carbide epitaxial wafer according to one aspect of the present disclosures.

There are various types of dislocations in silicon carbide epitaxial wafers. Among such dislocations, there is a diagonal line defect generated in the surface of a silicon carbide epitaxial layer. In the case in which a semiconductor device is fabricated at an area having such a diagonal line defect, heat is likely to be generated due to an increase of resistance in this area, resulting in the lowering of reliability.

The present disclosures are directed to providing a silicon carbide epitaxial wafer in which the occurrence of diagonal line defects in the surface of a silicon carbide epitaxial layer is reduced.

Embodiments will be described in the following. The same members or the like are referred to by the same numerals, and a description thereof will be omitted.

Description of Embodiments of the Present Disclosures

Embodiments of the present disclosures will be listed and described first. In the following description, the same or corresponding elements are referred to by the same reference numerals, and a duplicate description thereof will be omitted. For crystallographic descriptions in the present specification, the notations for a specific direction, a family of directions, a specific plane, and a family of planes are [ ], < >, ( ), and { }, respectively. The fact that a crystallographic index is negative is normally represented by "–" (bar) placed on top of a numeral. Notwithstanding this, the present specification uses the negative sign placed in front of a numeral to represent a negative crystallographic index. In the present disclosures, epitaxial growth is a homo-epitaxial growth.

[1] A silicon carbide epitaxial wafer according to an embodiment of the present disclosures includes a single crystal silicon carbide substrate of 4H polytype having a major surface thereof inclined at an angle $\theta$ to a {0001} plane toward a <11-20> direction, a silicon carbide epitaxial layer of a thickness t formed on the major surface, wherein a diameter of the single crystal silicon carbide substrate is greater than or equal to 150 mm, wherein the angle $\theta$ exceeds 0°, and is less than or equal to 6°, wherein one or more pairs of a screw dislocation pit and a diagonal line defect situated at a distance of t/tan θ from the pit are present in a surface of the silicon carbide epitaxial layer, and wherein a density of the pairs of a pit and a diagonal line defect is less than or equal to 2 pairs/cm².

The inventors of the present application have conducted studies to find that a pair of a screw dislocation pit and a diagonal line defect is present in a silicon carbide epitaxial wafer made by forming a silicon carbide epitaxial layer on a single crystal silicon carbide substrate. It has been found that the pair of a screw dislocation pit and a diagonal line defect originates from a long, narrow stacking fault in the single crystal silicon carbide substrate, and that a screw dislocation pit and a diagonal line defect constituting a pair are such that the diagonal line defect is situated at a distance of t/tan θ from the pit.

The pair of a screw dislocation pit and a diagonal line defect is likely to be generated when a silicon carbide epitaxial layer is formed on a single crystal silicon carbide substrate of 4H polytype having a diameter of 150 mm or more and having a major surface thereof inclined at an angle relative to the {0001} plane toward the <11-20> direction. In the case in which a semiconductor device is fabricated at an area having a diagonal line defect in such a silicon carbide epitaxial wafer, there is a risk that the reliability of the fabricated semiconductor device is lowered. Accordingly, when the density of pairs of a screw dislocation pit and a diagonal line defect present in a silicon carbide epitaxial wafer is set to be less than or equal to 2 pairs/cm², the lowering of reliability of a semiconductor device fabricated by using the silicon carbide epitaxial wafer may be prevented.

[2] The line width of the diagonal line defect is greater than or equal to 1 μm and less than or equal to 5 μm.

[3] The diagonal line defect is situated on a side of the pit that forms a pair with the diagonal line defect, the side being in the direction in which the surface of the silicon carbide epitaxial layer and the {0001} plane of the silicon carbide epitaxial layer come closer to each other.

[4] The density of the pairs of a pit and a diagonal line defect relative to the density of screw dislocations in the single crystal silicon carbide substrate is less than or equal to 0.11%.

[5] A single crystal silicon carbide substrate of 4H polytype having a major surface thereof inclined at an angle θ to a {0001} plane toward a <11-20> direction is provided, and a silicon carbide epitaxial layer of a thickness t formed on the major surface is provided, wherein a diameter of the single crystal silicon carbide substrate is greater than or equal to 150 mm, wherein the angle θ exceeds 0°, and is less than or equal to 6°, wherein one or more pairs of a screw dislocation pit and a diagonal line defect situated at a distance of t/tan θ from the pit are present in a surface of the silicon carbide epitaxial layer, wherein a density of the pairs of a pit and a diagonal line defect is less than or equal to 2 pairs/cm², wherein the line width of the diagonal line defect is greater than or equal to 1 μm and less than or equal to 5 μm, wherein the diagonal line defect is situated on a side of the pit that forms a pair with the diagonal line defect, the side being in the direction in which the surface of the silicon carbide epitaxial layer and the {0001} plane of the silicon carbide epitaxial layer come closer to each other, and wherein the density of the pairs of a pit and a diagonal line defect relative to the density of screw dislocations in the single crystal silicon carbide substrate is less than or equal to 0.11%.

Details of Embodiments of the Present Disclosures

In the following, an embodiment (hereinafter referred to as a present embodiment) of the present disclosures will be described in detail, with a caveat that the present embodiment is not limited to those described.

It is known that using a silicon carbide epitaxial wafer having a large number of lattice defects referred to as dislocations to manufacture a semiconductor device leads to the lowering of reliability of the semiconductor device. There is thus a demand for a silicon carbide epitaxial wafer having no dislocations. It is extremely difficult, however, to produce a silicon carbide epitaxial wafer having no dislocations.

There are various types of dislocations. When a semiconductor device is produced, some dislocations do not affect the characteristics, while other dislocations significantly affect the characteristics. From the viewpoint of manufacturing a semiconductor device, the presence of dislocations that do not affect the characteristics of a semiconductor device does not pose a problem. As for the dislocations affecting the characteristics of a semiconductor device, however, the fewer they are, the more preferable it is.

Accordingly, identifying the dislocations that affect the characteristics of a fabricated semiconductor device among various types of dislocations present in silicon carbide epitaxial wafers, and reducing the number of such dislocations to the minimum, are important challenges that are presented in developing silicon carbide epitaxial wafers. The present embodiment is based on the discovery of a new dislocation that affects the outcome of fabricating a semiconductor device, and reduces such dislocations to provide a silicon carbide epitaxial wafer that contributes to the manufacturing of a reliable semiconductor device.

[Silicon Carbide Epitaxial Wafer]

In the following, a silicon carbide epitaxial wafer 100 of the present embodiment will be described.

FIG. 1 is a cross-sectional view illustrating an example of the structure of the silicon carbide epitaxial wafer 100 according to the present embodiment. The silicon carbide epitaxial wafer 100 of the present embodiment includes a single crystal silicon carbide substrate 10 having a major surface 10A inclined at an off-angle θ relative to a predetermined crystal plane and a silicon carbide epitaxial layer 11 formed on the major surface 10A of the single crystal silicon carbide substrate 10. The predetermined crystal plane is preferably the (0001) plane or the (000-1) plane.

It may be noted that the polytype of silicon carbide in the single crystal silicon carbide substrate 10 is 4H. The 4H polytype silicon carbide is used due to its superiority to other polytypes in terms of electron mobility, dielectric breakdown electric field strength, and the like. The diameter of the single crystal silicon carbide substrate 10 is greater than or equal to 150 mm (e.g., greater than or equal to 6 inches). This is because the larger the diameter is, the more advantageous it is in reducing manufacturing costs. The major surface 10A of the single crystal silicon carbide substrate 10 is inclined at an off-angle θ of 4° relative to the {0001} plane toward the <11-20> direction. It may be noted that the off-angle θ in the present embodiment exceeds 0°, and is less than or equal to 6°.

In the silicon carbide epitaxial wafer 100 of the present embodiment, a pair of a diagonal line defect and a screw dislocation pit is present that originates from a long, narrow stacking fault formed in the single crystal silicon carbide substrate 10 and develops upon the forming of the silicon carbide epitaxial layer 11. The number of pairs of a diagonal line defect and a screw dislocation pit is less than or equal to 2 pairs/cm₂.

In the case in which a semiconductor device is fabricated at an area having a diagonal line defect in such a silicon carbide epitaxial wafer, there is a risk that the reliability of the fabricated semiconductor device is lowered. From the viewpoint of the reliability of a semiconductor device manufactured by using a silicon carbide epitaxial wafer, the lower the density of pairs of a diagonal line defect and a screw dislocation pit is, the better the outcome is. Ideally, the density is zero. However, it is extremely difficult to reduce the number of pairs of a diagonal line defect and a screw dislocation pit to zero. It is thus preferable that the number of pairs of a diagonal line defect and a screw dislocation pit is less than or equal to 2 pairs/cm$^2$. Use of the silicon carbide epitaxial wafer 100 of the present embodiment allows a highly reliable semiconductor device to be manufactured.

[Oblique Line Defect]

Figure 2:
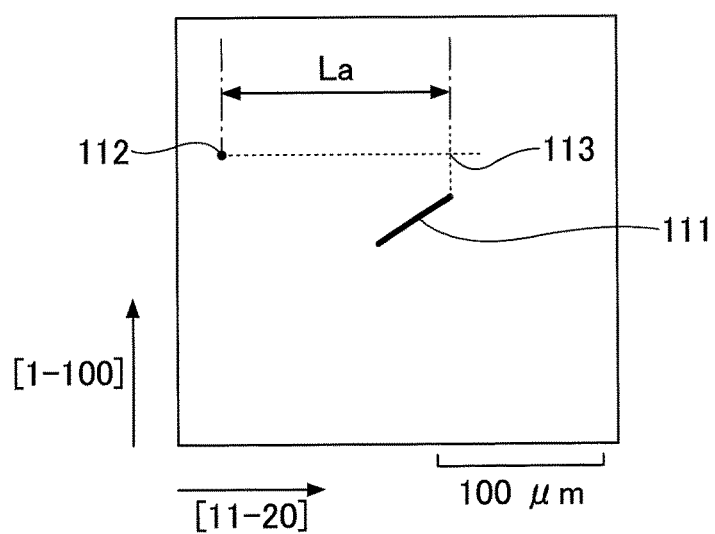
FIG. 2 is a schematic top view illustrating a screw dislocation pit and a diagonal line defect in a surface of the silicon carbide epitaxial wafer.
Figure 3:
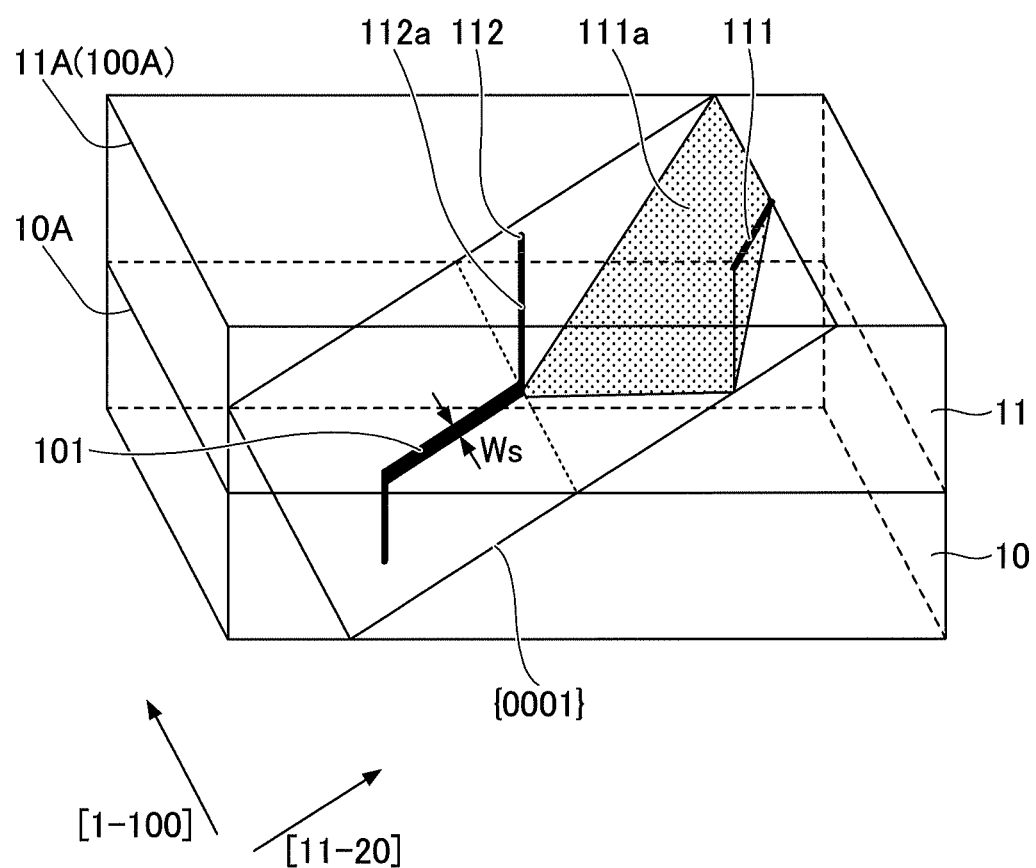
FIG. 3 is a schematic oblique view illustrating the relationships between a screw dislocation pit and a diagonal line defect.
Figure 4:
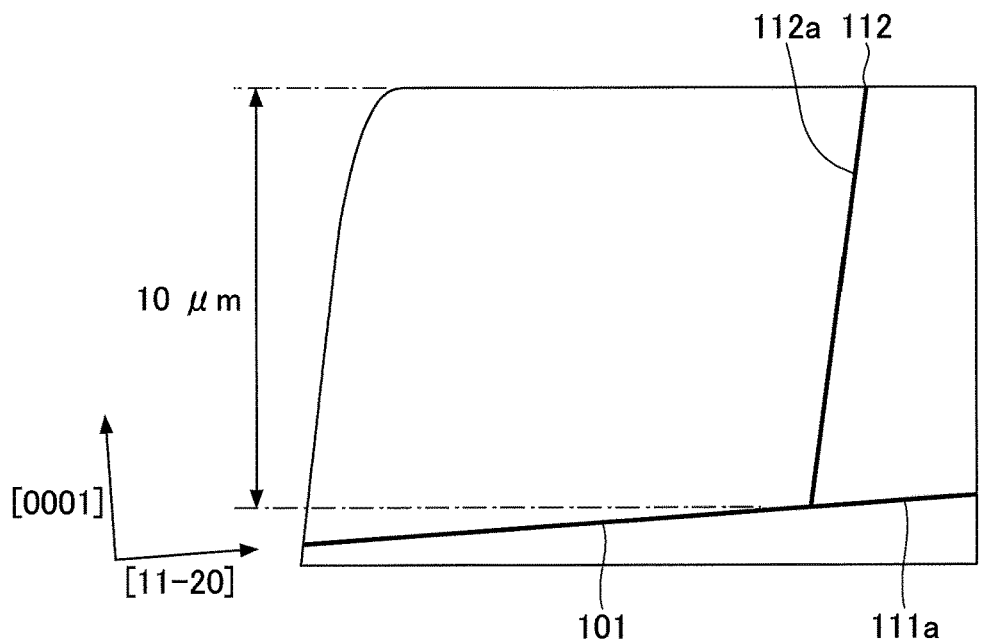
FIG. 4 is a drawing schematically illustrating a cross-section of the silicon carbide epitaxial wafer.
Figure 5:
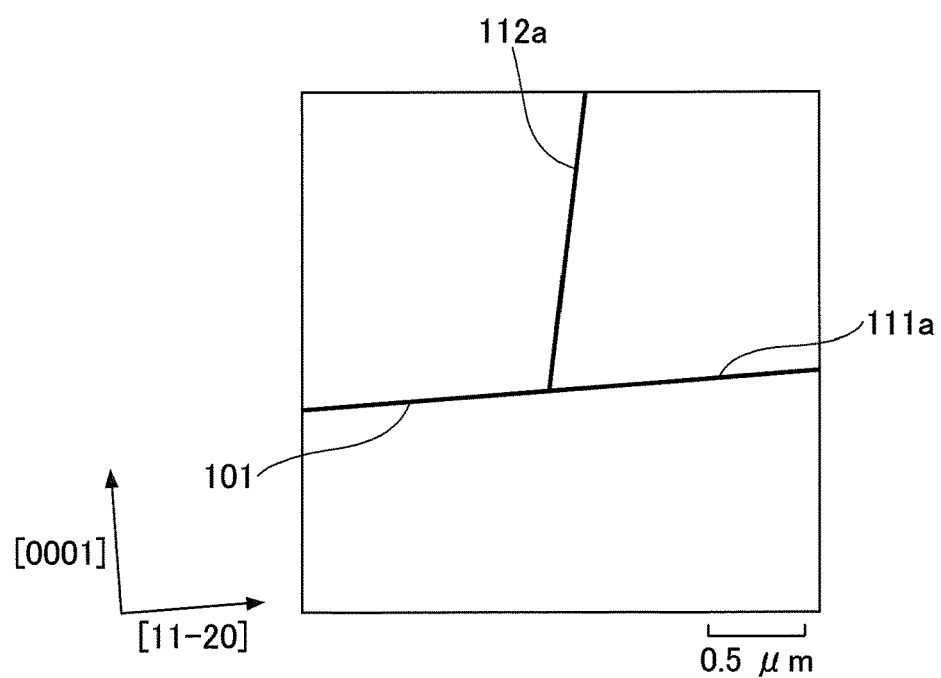
FIG. 5 is an enlarged view of a main portion of FIG. 4.

The above-described pair of a diagonal line defect and a screw dislocation pit will be described with reference to FIG. 2 through FIG. 5. FIG. 2 is a top view of the silicon carbide epitaxial wafer 100. FIG. 3 is an oblique view. FIG. 4 is a cross-sectional view. FIG. 5 is an enlarged view of the cross-section illustrated in FIG. 4. An diagonal line defect 111 and a screw dislocation pit 112 of the above-described pair are situated apart from each other in the surface of the silicon carbide epitaxial wafer 100, and originate from an end of a long, narrow stacking fault 101 formed in the single crystal silicon carbide substrate 10 as illustrated in FIG. 3 and FIG. 4. The long, narrow stacking fault 101 is a narrow-width stacking fault having a width Ws of approximately 0.5 μm.

Specifically, the silicon carbide epitaxial wafer 100 is such that the silicon carbide epitaxial layer 11 is formed on the major surface 10A of the single crystal silicon carbide substrate 10 through epitaxial growth of silicon carbide. In the case of the long, narrow stacking fault 101 being present in the single crystal silicon carbide substrate 10, the long, narrow stacking fault 101 is exposed in the major surface 10A of the single crystal silicon carbide substrate 10.

When the silicon carbide epitaxial layer 11 is formed on the major surface 10A of the above-noted single crystal silicon carbide substrate 10, the long, narrow stacking fault 101 exposed in the major surface 10A of the single crystal silicon carbide substrate 10 branches into a screw dislocation 112a and a stacking fault 111a, each of which then grows. The stacking fault 111a has a width that gradually widens as the crystal growth of the silicon carbide epitaxial layer 11 continues, resulting in the formation of the diagonal line defect 111 in a surface 11A of the silicon carbide epitaxial layer 11. Further, the screw dislocation 112a causes the pit 112 to be formed in the surface 11A of the silicon carbide epitaxial layer 11.

The surface 11A of the silicon carbide epitaxial layer 11 is a surface 100A of the silicon carbide epitaxial wafer 100. Although the surface 100A of the silicon carbide epitaxial wafer 100 has the pit 112 of the screw dislocation 112a and the diagonal line defect 111 formed at spaced apart locations, the distance between the pit 112 and the diagonal line defect 111 is substantially constant because the cause is the same long, narrow stacking fault 101. Specifically, the diagonal line defect 111 is the stacking fault 111a exposed in the surface 100A of the silicon carbide epitaxial wafer 100. In the case of the thickness of the silicon carbide epitaxial layer 11 being t, thus, the diagonal line defect 111 is situated at a distance of $L=t/\tan\theta$ from the pit 112. In the case of t being 10 μm and θ being 4°, for example, the diagonal line defect 111 that is situated at a distance of L=142 μm from the pit 112 occurs as a result of the long, narrow stacking fault 101 that is one and the same as the pit 112. Here, the distance between the pit 112 and the diagonal line defect 111 refers to a distance La between the pit 112 and an intersection between the straight line extending in parallel to the off direction from the pit 112, i.e., the straight line extending in parallel to the [11-20] direction, and the straight line extending perpendicularly to the off direction from the end of the diagonal line defect 111 most downstream in the off direction, i.e., the straight line extending in parallel to the [1-100] direction.

The diagonal line defect 111 and the pit 112 of the screw dislocation 112a having such a positional relationship are caused by the same long, narrow stacking fault 101, and are thus sometimes referred to as a pair of a diagonal line defect 111 and a pit 112 of a screw dislocation 112a the present application. In the silicon carbide epitaxial wafer 100 of the present embodiment, the pairs of a diagonal line defect 111 and a pit 112 of a screw dislocation 112a exist at a density less than or equal to 2 pairs/cm$^2$.

Figure 6:
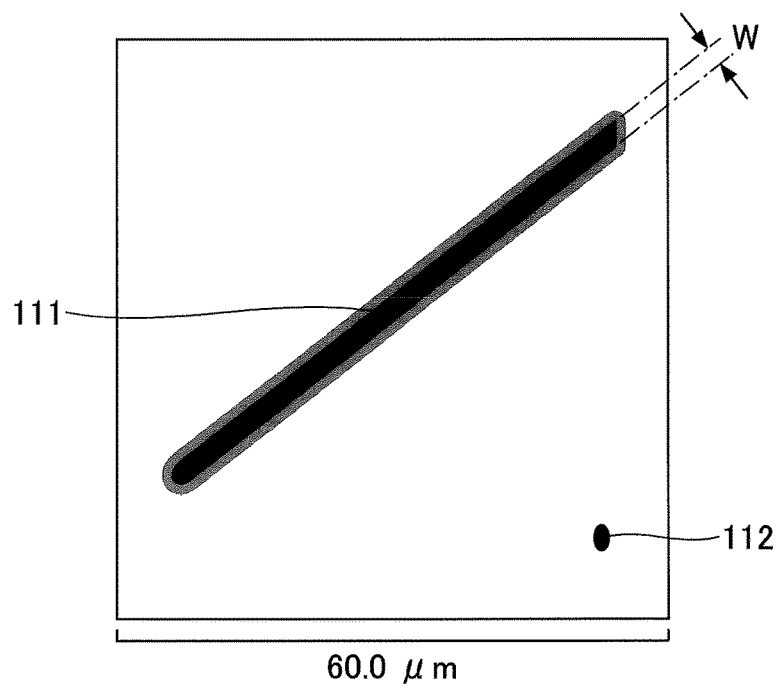
FIG. 6 is a schematic enlarged view of a diagonal line defect in the surface of the silicon carbide epitaxial wafer.

As illustrated in FIG. 6, the line width W of the diagonal line defect 111, i.e., the width of the diagonal line defect 111 measured in a direction perpendicular to the longitudinal direction thereof, is greater than or equal to 1 μm and less than or equal to 5 μm. Further, since the diagonal line defect 111 is the stacking fault 111a exposed in the surface 100A of the silicon carbide epitaxial wafer 100, the diagonal line defect 111 appears on the side of the pit 112 in the direction in which the {0001} plane and the surface 100A of the silicon carbide epitaxial wafer 100 come closer to each other.

Figure 7:
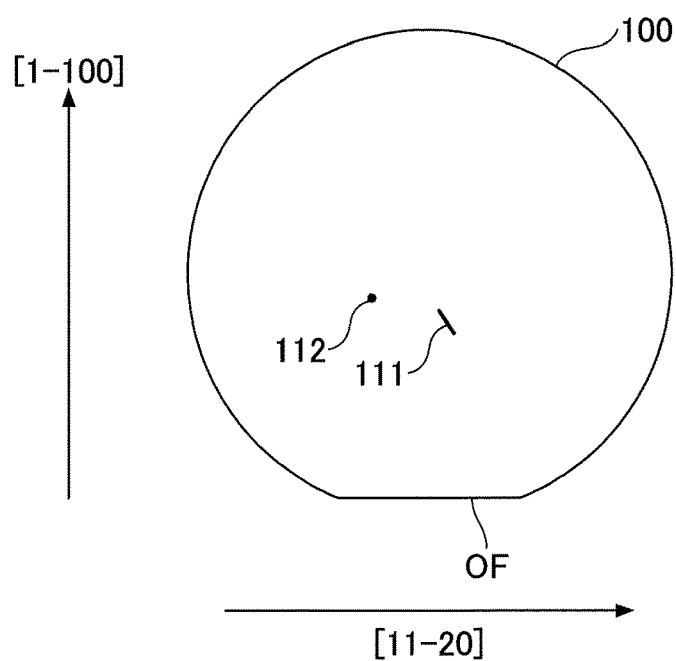
FIG. 7 is a top view schematically illustrating the silicon carbide epitaxial wafer according to one aspect of the present disclosures.

For example, as illustrated in FIG. 7, the direction extending from left to right along the orientation flat (OF) of the silicon carbide epitaxial wafer 100 is the [11-20] direction, and a direction perpendicular to the [11-20] direction is the [1-100] direction. In this case, the diagonal line defect 111 in the silicon carbide epitaxial wafer 100 appears on the right-hand side of the pit 112 of the screw dislocation 112a.

[Cause of Oblique Line Defect]

In the following, the cause of the occurrence of the diagonal line defect 111 will be described. As was previously described, the diagonal line defect 111 occurring in the surface 100A of the silicon carbide epitaxial wafer 100 occurs as a result of the long, narrow stacking fault 101 occurring in the single crystal silicon carbide substrate 10 prior to the formation of the silicon carbide epitaxial layer 11. The long, narrow stacking fault 101 is a stacking fault with the width Ws thereof being approximately 0.5 μm, and is considered to occur as a result of a screw dislocation that develops when forming the single crystal silicon carbide substrate 10.

Figure 8:
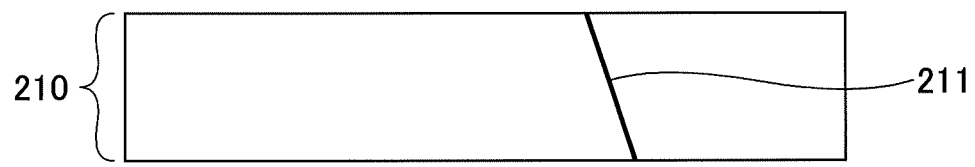
FIG. 8 is a schematic process diagram (1) of a manufacturing process for the silicon carbide epitaxial wafer.
Figure 9:
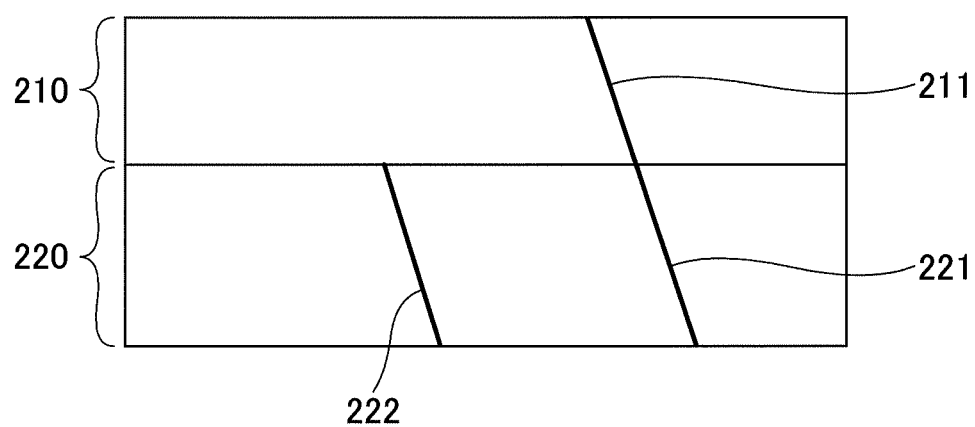
FIG. 9 is a schematic process diagram (2) of the manufacturing process for the silicon carbide epitaxial wafer.

In consideration of the above, a method of making the single crystal silicon carbide substrate 10 will be described first with reference to FIG. 8 through FIG. 11. The single crystal silicon carbide substrate 10 is made by a sublimation process. Specifically, a single crystal silicon carbide substrate 210 serving as a seed crystal is prepared in advance as illustrated in FIG. 8. As illustrated in FIG. 9, then, a single crystal silicon carbide 220 is grown by crystal growth on the surface of the single crystal silicon carbide substrate 210.

For the single crystal silicon carbide substrate 210 serving as a seed crystal, a substrate having as few dislocations as possible is prepared through rigorous selection process due to its use as a seed for crystal growth. Nonetheless, the single crystal silicon carbide substrate 210 serving as a seed crystal still has a screw dislocation 211 or the like because it is extremely difficult to obtain a substrate having no dislocations. When such a single crystal silicon carbide substrate 210 is used to form the single crystal silicon carbide 220 through crystal growth based on a sublimation process, the screw dislocation 211 existing in the single crystal silicon carbide substrate 210 serving as a seed crystal continues as a screw dislocation 221 developing in the single crystal silicon carbide 220. Moreover, a new screw dislocation 222 may develop in the single crystal silicon carbide 220 as a result of a foreign substance, an irregular surface, or the like present on the surface of the single crystal silicon carbide substrate 210 serving as a seed crystal.

Figure 10:
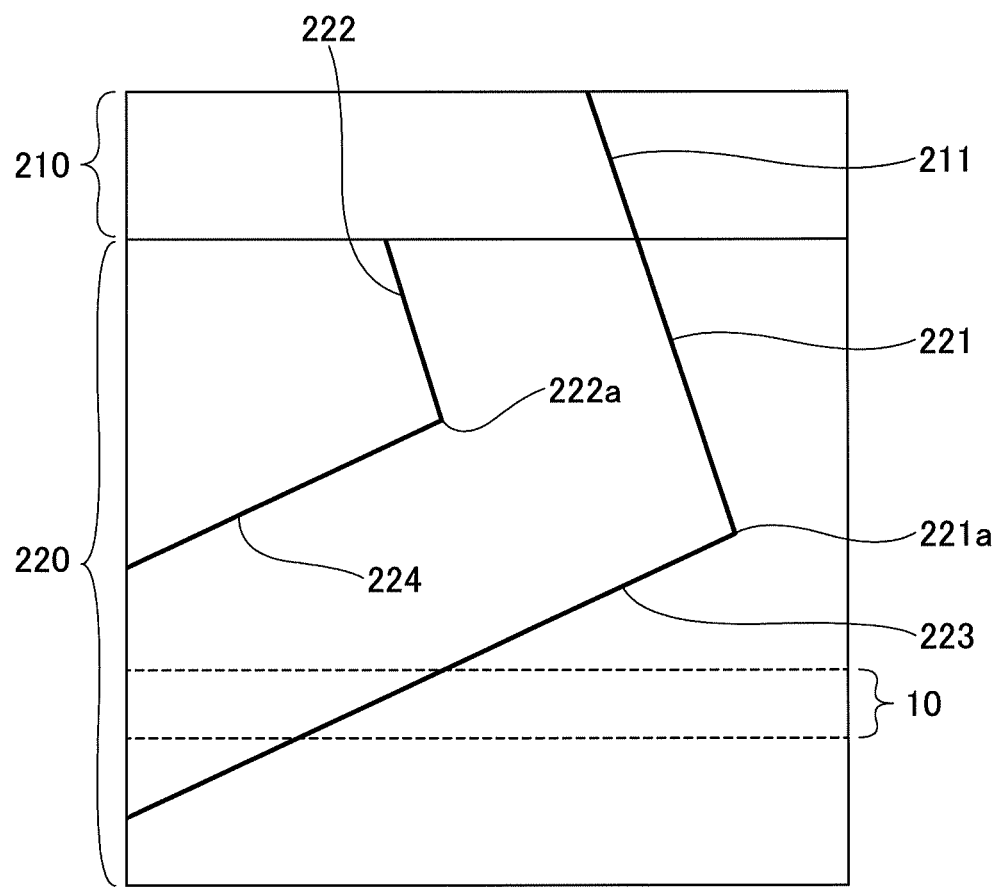
FIG. 10 is a schematic process diagram (3) of the manufacturing process for the silicon carbide epitaxial wafer.

The screw dislocations 221 and 222 in the single crystal silicon carbide 220 continuously extend to a certain length with the crystal growth of the single crystal silicon carbide 220, and, in some cases, may turn at an intermediate point to develop into long, narrow stacking faults 223 and 224 as illustrated in FIG. 10. To be more specific, the screw dislocation 221 develops into the long, narrow stacking fault 223 at an intermediate turning point 221a, and then grows at a sideways angle relative to the direction of the extension of the screw dislocation 221. Further, the screw dislocation 222 develops into the long, narrow stacking fault 224 at an intermediate turning point 222a, and then grows at a sideways angle relative to the direction of the extension of the screw dislocation 222. In this manner, during the crystal growth of the single crystal silicon carbide 220, the screw dislocations 221 and 222 turn into the long, narrow stacking faults 223 and 224 with the progress of crystal growth, so that the number of screw dislocations decreases as the crystal growth of the single crystal silicon carbide 220 comes near to the end. As a result of crystal growth of the single crystal silicon carbide 220 based on a sublimation process, a silicon carbide ingot as illustrated in FIG. 10 is made.

Figure 11:
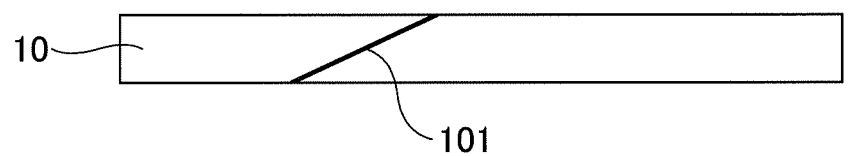
FIG. 11 is a schematic process diagram (4) of the manufacturing process for the silicon carbide epitaxial wafer.

The single crystal silicon carbide substrate 10 is produced by slicing the ingot of the single crystal silicon carbide 220 illustrated in FIG. 10 at a predetermined thickness by use of a wire saw. In the single crystal silicon carbide substrate 10 produced in this manner, part of the long, narrow stacking fault 223 or the like formed in the ingot of the single crystal silicon carbide 220 may appear as the long, narrow stacking fault 101 in the single crystal silicon carbide substrate 10 as illustrated in FIG. 11, depending on the position of the sliced piece. It may be noted that the screw dislocation 221 or the like that causes the formation of the long, narrow stacking fault 101 may be, or may not be, detectable, depending on the position of the slice in the ingot of the single crystal silicon carbide 220.

[Manufacturing of Silicon Carbide Epitaxial Wafer]

As was described above, when the single crystal silicon carbide substrate 10 is made by use of a sublimation process, the single crystal silicon carbide substrate 10 may include the long, narrow stacking fault 101 in some cases. The present embodiment directed to a silicon carbide epitaxial wafer manufactured by use of the single crystal silicon carbide substrate 10, in which the density of pairs of a screw dislocation 112a and a diagonal line defect 111 occurring in the silicon carbide epitaxial layer 11 is less than or equal to 2 pairs/cm$^2$.

The silicon carbide epitaxial wafer of the present embodiment is manufactured by polishing a sliced single crystal silicon carbide substrate 10 and deposit the silicon carbide epitaxial layer 11 on the polished single crystal silicon carbide substrate 10. In consideration of this, a description will first be given of a polishing apparatus used in the polishing of the single crystal silicon carbide substrate 10 and a deposition apparatus used in the deposition of the silicon carbide epitaxial layer 11.

[Polishing Apparatus]

Figure 12:
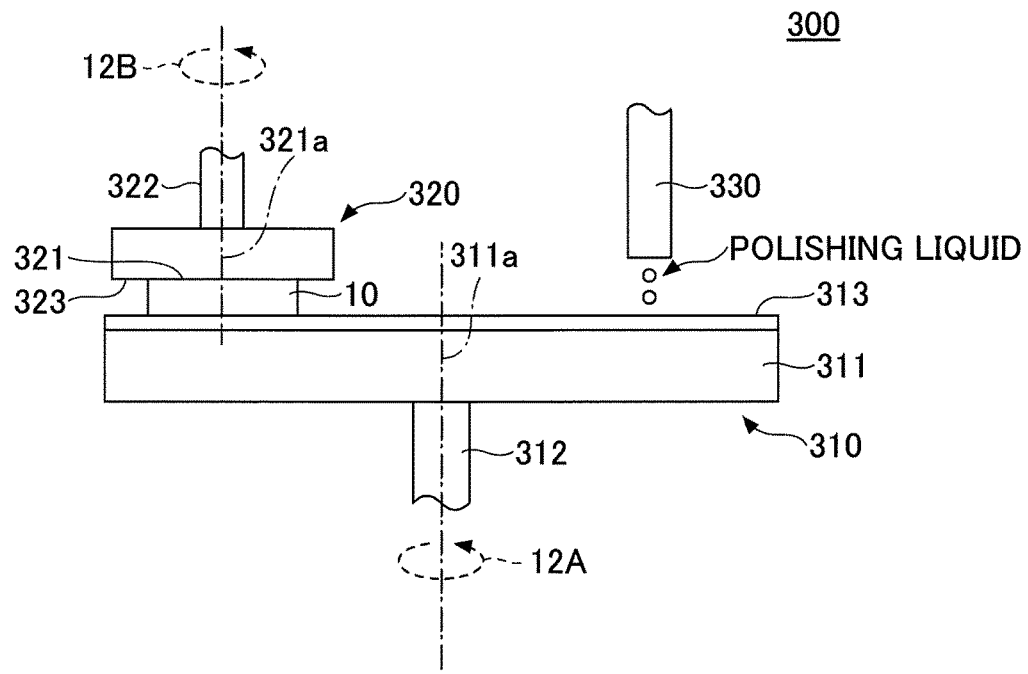
FIG. 12 is a schematic side-elevation view illustrating an example of the configuration of a polishing apparatus.

Polishing of the single crystal silicon carbide substrate 10 is performed by use of a polishing apparatus 300 as illustrated in FIG. 12. The polishing apparatus 300 includes a platen 310, a holder 320, and a polishing liquid feeder 330. The platen 310 has a disc-shaped body 311 and a rotating shaft 312 for rotating the body 311 around an axial center 311a of the body 311. A polishing cloth 313 is provided on one surface of the body 311, serving as a polishing face. The rotating shaft 312 is provided on the other surface of the body 311. The rotating shaft 312 is rotated in the direction indicated by a dashed-line arrow 12A by a rotating mechanism such as a motor (not shown) to rotate the platen 310.

The holder 320 has a disc-shaped body 321 and a rotating shaft 322 for rotating the body 321 around an axial center 321a of the body 321. One surface of the body 321 serves as a hold face 323 for holding the single crystal silicon carbide substrate 10. The surface of the single crystal silicon carbide substrate 10 opposite the surface on which the silicon carbide epitaxial layer 11 is formed is held at the hold face 323 of the holder 320. Accordingly, the surface of the single crystal silicon carbide substrate 10 which is to be polished, and on which the silicon carbide epitaxial layer 11 is formed, faces the polishing face of the platen 310 on which the polishing cloth 313 is provided. The rotating shaft 322 of the holder 320 is situated on the other surface of the body 321. The rotating shaft 322 is rotated in the direction indicated by a dashed-line arrow 12B by a rotating mechanism such as a motor (not shown) to rotate the holder 320.

The polishing liquid feeder 330, which is disposed over the polishing face of the platen 310 having the polishing cloth 313, supplies a polishing liquid to the polishing cloth 313 of the platen 310. In order to polish the single crystal silicon carbide substrate 10, the platen 310 and the holder 320 are rotated while the polishing liquid feeder 330 supplies a polishing liquid to the polishing cloth 313 of the platen 310.

[Deposition Apparatus]

Figure 13:
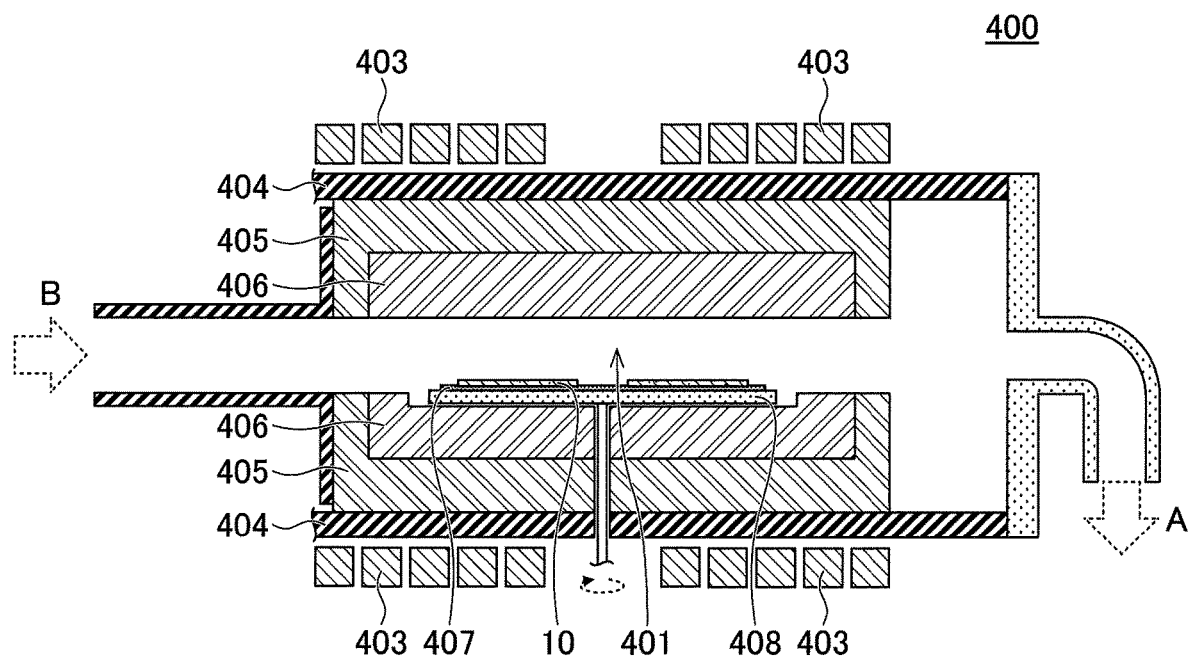
FIG. 13 is a schematic cross-sectional view illustrating an example of the configuration of a deposition apparatus.
Figure 14:
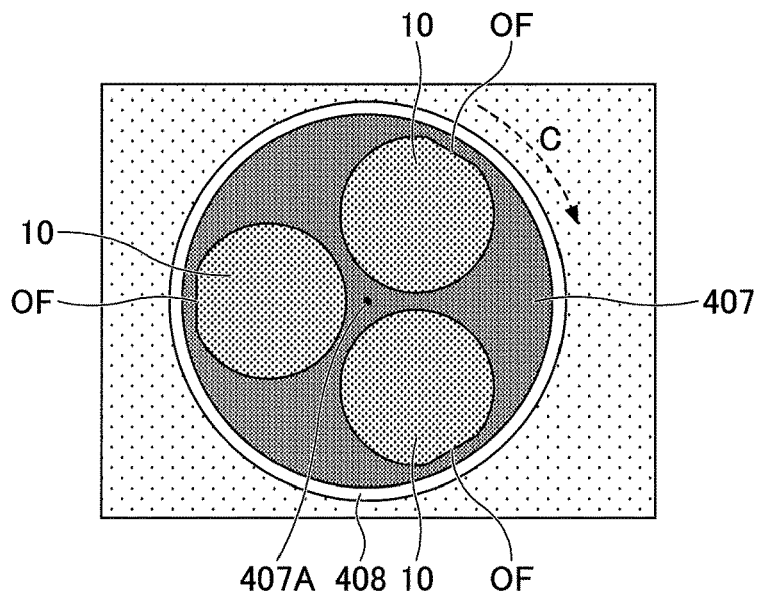
FIG. 14 is a schematic top view illustrating the inside of a chamber of the deposition apparatus.

In the following, a deposition apparatus for manufacturing a silicon carbide epitaxial wafer of the present embodiment will be described with reference to FIG. 13 and FIG. 14. FIG. 13 is a schematic cross-sectional view illustrating an example of the configuration of a deposition apparatus used in the present embodiment. FIG. 14 is a top view of the interior of the chamber of the deposition apparatus as viewed from above. A deposition apparatus 400 illustrated in FIG. 13 and FIG. 14 is a horizontal hot-wall CVD (chemical vapor deposition) apparatus. As illustrated in FIG. 13, the deposition apparatus 400 includes an induction heating coil 403, a quartz tube 404, a heat insulation material 405, and a heating element 406. The heating element 406 may be made of carbon, for example. The heating element 406 is a unitary, seamless piece formed into a rectangular tube. Two flat surfaces are formed inside the rectangular tube heating element 406 to face each other. The space surrounded by the two flat surfaces constitutes a chamber 401. The chamber 401 is also referred to as a "gas flow channel". As illustrated in FIG. 14, a substrate holder 407 on which a plurality of (e.g., three) single crystal silicon carbide substrates 10 can be placed is mounted on a rotating susceptor 408 inside the chamber 401.

The heat insulation material 405 is disposed to surround the outer perimeter of the heating element 406. The chamber 401 is insulated from the outside of the deposition apparatus 400 by the heat insulation material 405. The quartz tube 404 is disposed to surround the outer perimeter of the heat insulation material 405. The induction heating coil 403 is wound around the outer perimeter of the quartz tube 404.

The deposition apparatus 400 is configured such that an alternating current is supplied to the induction heating coil 403 to cause the induction heating of the heating element 406 to control temperature inside the chamber 401. Since the heat insulation material 405 provides insulation, the quartz tube 404 is hardly heated.

In the deposition apparatus 400 illustrated in FIG. 13, the chamber 401 is evacuated in the direction indicated by a dashed-line arrow A. In the case of depositing the silicon carbide epitaxial layer 11, a gas containing carbon and a gas containing silicon serving as raw-material gasses, a hydrogen ($H_2$) gas serving as a carrier gas, and a gas containing nitrogen according to need are supplied in the direction indicated by a dashed-line arrow B. In the present embodiment, a propane ($C_3H_8$) gas or the like is used as the gas containing carbon, and a silane ($SiH_4$) gas or the like is used as the gas containing silicon.

At the time of depositing the silicon carbide epitaxial layer 11, the rotating susceptor 408 is rotated to provide rotation in the direction indicated by a dashed-line arrow C around the rotational axis 407A of the substrate holder 407. With this arrangement, the single crystal silicon carbide substrates 10 placed on the substrate holder 407 are revolved. In the present embodiment, the substrate holder 407 is rotated by rotating the rotating susceptor 408 around the axis that is perpendicular to the major surface 10A of the single crystal silicon carbide substrate 10. The rotation rate of the rotating susceptor 408 is greater than or equal to 10 RPM and less than or equal to 100 RPM, for example. In the deposition apparatus 400, silicon carbide epitaxial layers 11 can be simultaneously deposited on a plurality of (e.g., three) single crystal silicon carbide substrates 10, for example. It may be noted that the substrate holder 407 is rotated by a gas-flow method, for example.

[Method of Manufacturing Silicon Carbide Epitaxial Wafer]

Figure 15:
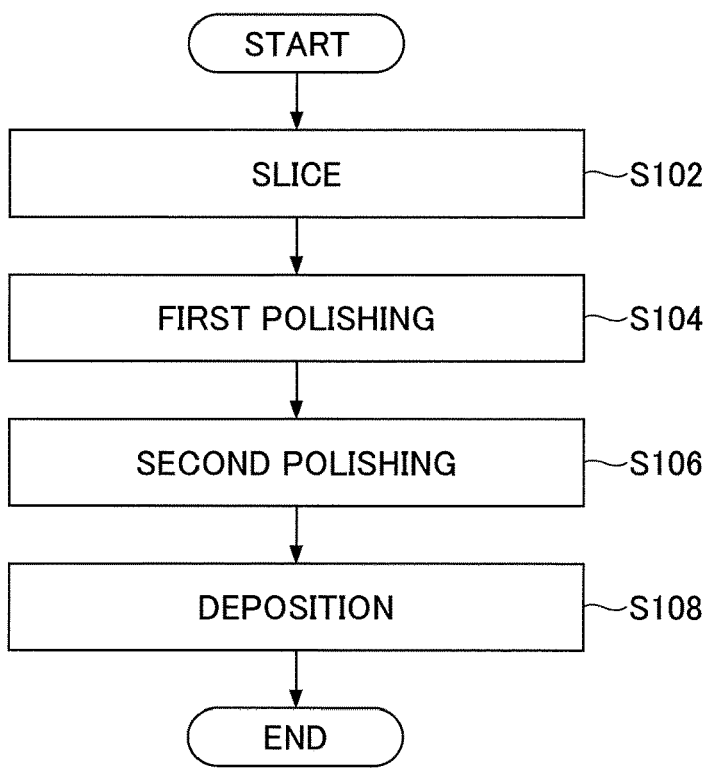
FIG. 15 is a flowchart schematically illustrating a method of manufacturing the silicon carbide epitaxial wafer according to one aspect of the present disclosures.

A method of manufacturing a silicon carbide epitaxial wafer of the present embodiment will be described with reference to FIG. 15.

A slicing step (S102) is performed first. Specifically, an ingot of the single crystal silicon carbide 220 made by a sublimation process as illustrated in FIG. 10 is sliced into a single crystal silicon carbide substrate.

A first polishing step (S104) is then performed. Specifically, first polishing is performed on the surface of the single crystal silicon carbide substrate 10 that is to become the major surface 10A. In the first polishing, an polishing liquid containing colloidal silica is used to polish the surface of the single crystal silicon carbide substrate 10 that is to become the major surface 10A. The polishing liquid is supplied from the polishing liquid feeder 330 of the polishing apparatus 300 illustrated in FIG. 12. The particle diameter of $SiO_2$ contained in the polishing liquid is preferably greater than or equal to 10 nm and less than or equal to 100 nm, for example. The pH value of the polishing liquid ranges between 3.0 and 6.5, and the colloidal silica concentration ranges between 5% and 40%. After completing the colloidal-silica-based polishing, the single crystal silicon carbide substrate 10 is immersed in an alkaline chemical solution. Examples of the alkaline chemical solution include TMAH (Tetramethylammonium hydroxide), organic alkali, and a mixture of ammonia, hydrogen peroxide, and water. In the present embodiment, the single crystal silicon carbide substrate 10 having undergone the colloidal-silica-based polishing is immersed in a TMAH water solution serving as an alkaline chemical solution. The pH value of the TMAH water solution is greater than or equal to 11. The TMAH concentration in the chemical solution is greater than or equal to 10%. The temperature of the chemical solution preferably ranges between 15° C. and 30° C.

Immediately after the colloidal-silica-based polishing, the surface of the single crystal silicon carbide substrate 10 that is to become the major surface 10A is positively charged in acidic areas, while the zeta potential of colloidal silica is negatively charged. Because of this, colloidal silica is attracted to the surface of the single crystal silicon carbide substrate 10 that is to become the major surface 10A. In the present embodiment, the single crystal silicon carbide substrate 10 that has been polished by using colloidal silica is immersed in an alkaline chemical solution, so that the zeta potential of the surface of the single crystal silicon carbide substrate 10 to become the major surface 10A is changed to negative. As a result, the surface of the single crystal silicon carbide substrate 10 to become the major surface 10A and colloidal silica repel each other, which reduces the likelihood of colloidal silica being adhered to the surface of the single crystal silicon carbide substrate 10 that is to become the major surface 10A. Subsequently, the single crystal silicon carbide substrate 10 is washed with water, and is then dried.

A second polishing step (S106) is then performed. Specifically, second polishing is performed on the surface of the single crystal silicon carbide substrate 10 that is to become the major surface 10A. In the second polishing, a polishing liquid containing both diamond polishing powder serving as polishing agent and an oxidizing agent such as permanganate ion is used as a polishing agent to polish the surface of the single crystal silicon carbide substrate 10 that is to become the major surface 10A. The polishing liquid is supplied from the polishing liquid feeder 330 of the polishing apparatus 300 illustrated in FIG. 12. A non-woven cloth is used as a polishing cloth, and a mixture of an oxidizing agent and diamond polishing powder is used as the polishing liquid. Diamond polishing powder serving as the polishing agent, which is also referred to as nano-diamond, is arranged such that the powder with a primary particle diameter of 4 nm to 6 nm is dispersed in pure water at a rate of 20 wt %. Examples of the oxidizing agent include potassium permanganate dissolved in pure water, wherein the mixing ratio is 1 g of potassium permanganate per liter of pure water. Mechanical work is performed with the rotation rate of the platen 310 being set to 60 rpm and the rotation rate of the holder 320 being set to 80 rpm. After the second polishing is completed, the single crystal silicon carbide substrate 10 is washed with water, and then dried. After this, the single crystal silicon carbide substrate 10 is immersed in an alkaline chemical solution, washed with water, and dried.

A deposition step (S108) is then performed. Specifically, the silicon carbide epitaxial layer 11 is deposited on the major surface 10A of the single crystal silicon carbide substrate 10.

Figure 16:
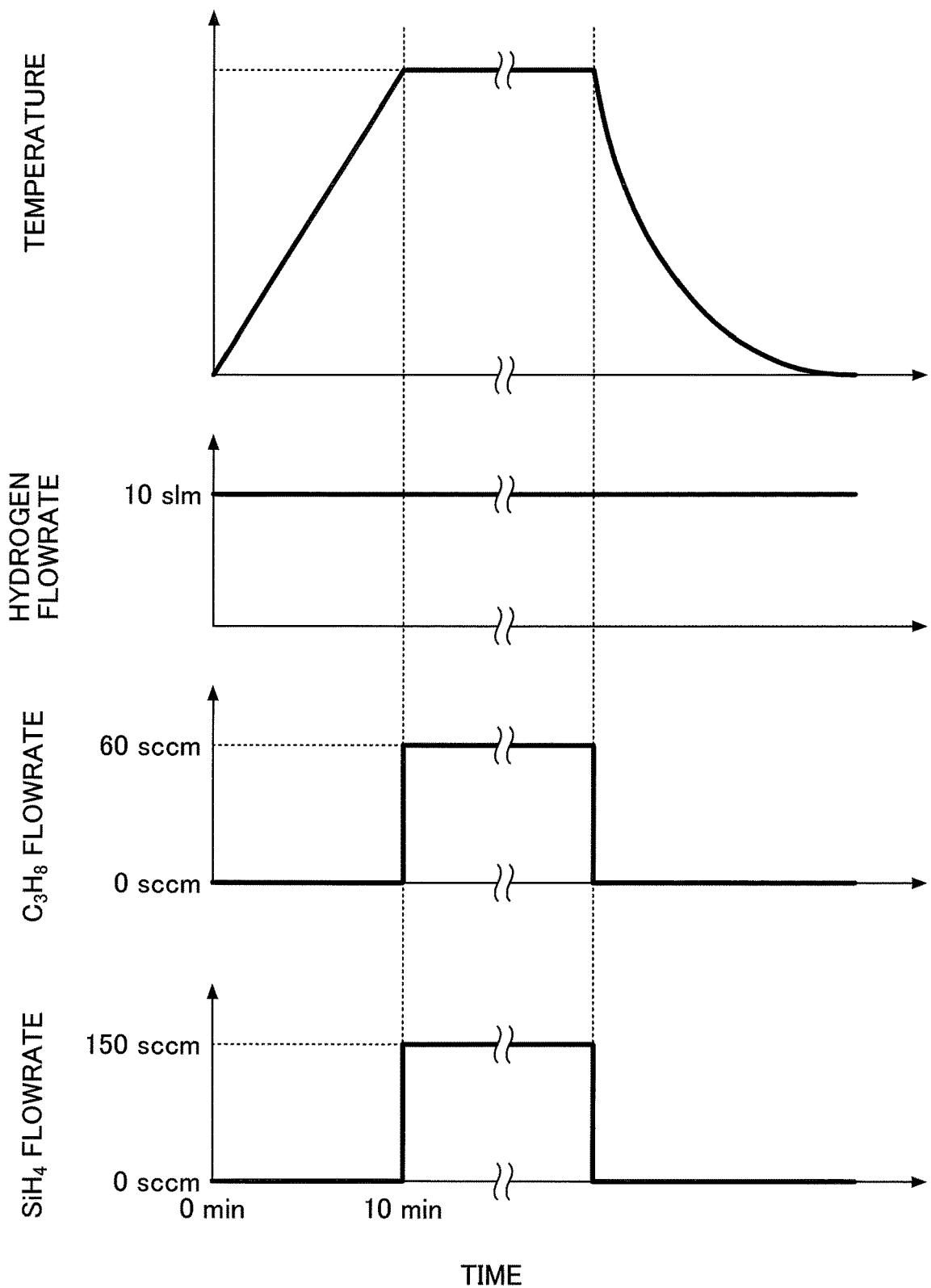
FIG. 16 is a timing chart illustrating an example of the control of temperature and gas flowrates inside the deposition apparatus.

To be more specific, the single crystal silicon carbide substrates 10 are disposed at predetermined locations on the substrate holder 407 inside the chamber 401 of the deposition apparatus 400 illustrated in FIG. 13 and FIG. 14. A vacuum pump (not shown) mounted on the deposition apparatus 400 is then activated to decompress the inside of the chamber 401. Decompression is continued until pressure inside the chamber 401 reaches approximately $1\times10^{-6}$ Pa. FIG. 16 is a timing chart illustrating the control of temperature and gas flowrates in the chamber 401 in a step following the decompression of the chamber 401. After the decompression of the chamber 401 is completed, hydrogen ($H_2$) gas is fed into the chamber 401 at a flowrate of 10 slm, and the inside of the chamber 401 is heated. Heating of the inside of the chamber 401 is rapid such that temperature increases to 1600° C. in approximately 10 minutes. An increase in the heating time causes irregularities resulting from the long, narrow stacking fault 101 of the single crystal silicon carbide substrate 10 to be increasingly likely to appear at the major surface 10A of the single crystal silicon carbide substrate 10. It is thus preferable to have as short heating time as possible. Upon the temperature in the chamber 401 reaching 1600° C., 60 sccm of propane ($C_3H_8$) gas and 150 sccm of silane ($SiH_4$) gas are fed while a hydrogen gas is being fed, which causes the silicon carbide epitaxial layer 11 to be deposited on the major surface 10A of the single crystal silicon carbide substrate 10. After the deposited thickness of the silicon carbide epitaxial layer 11 reaches a predetermined film thickness, the supply of propane gas and silane gas is stopped, and heating the inside of the chamber 401 of the deposition apparatus 400 is stopped. After the temperature inside the chamber 401 sufficiently drops, the pressure inside the chamber 401 is returned to an atmospheric pressure. The silicon carbide epitaxial wafer 100 having the deposited silicon carbide epitaxial layer 11 is then unloaded from the chamber 401.

The silicon carbide epitaxial wafer 100 of the present embodiment manufactured in this manner is such that the number of pairs of a diagonal line defect and a screw dislocation pit in the surface 100A of the silicon carbide epitaxial wafer 100 is less than or equal to 2 pairs/cm$^2$.

Figure 17:
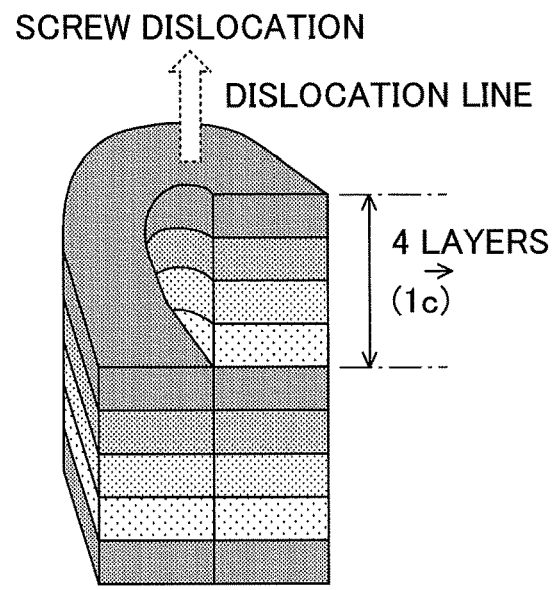
FIG. 17 is an illustrative drawing (1) illustrating the occurrence of a long, narrow stacking fault.
Figure 18:
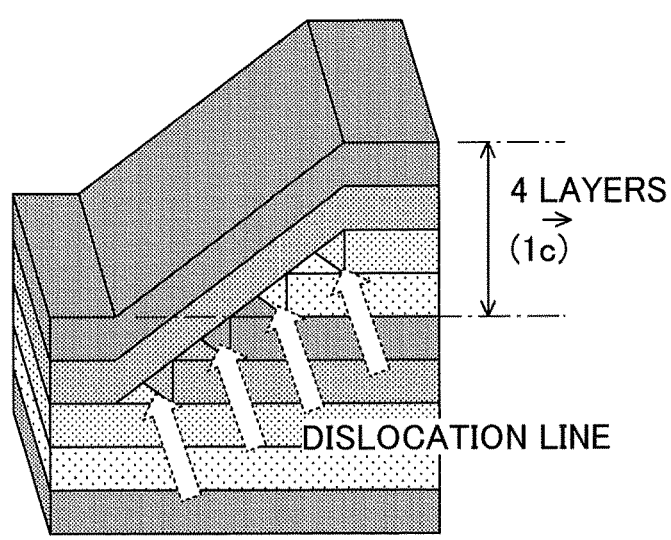
FIG. 18 is an illustrative drawing (2) illustrating the occurrence of a long, narrow stacking fault.

It may be noted that the long, narrow stacking fault 101 occurs as a result of a change in the direction of the dislocation line of a screw dislocation. Namely, in the case in which a screw dislocation as illustrated in FIG. 17 is present in the single crystal silicon carbide substrate 10, the direction of the dislocation line of a screw dislocation may change, resulting in the occurrence of a long, narrow stacking fault as illustrated in FIG. 18. Accordingly, the density of screw dislocations and the density of long, narrow stacking faults 101 are related to each other in the single crystal silicon carbide substrate 10.

EXAMPLE

In the following, silicon carbide epitaxial wafer samples 1 through 4, which are examples of the silicon carbide epitaxial wafer of the present embodiment, will be described. Table 1 given below shows the density (A) of screw dislocations in the single crystal silicon carbide substrate 10 and the density (B) of pairs of a pit 112 and a diagonal line defect ill in the surface 11A of the silicon carbide epitaxial layer 11. Further, the ratio (B/A) between the density (B) of pairs of a pit 112 and a diagonal line defect 111 in the surface 11A of the silicon carbide epitaxial layer 11 and the density (A) of screw dislocations in the single crystal silicon carbide substrate 10 is shown alongside.

TABLE 1

| | Density (A) of Screw Dislocations in Single Crystal Silicon Carbide Substrate (dislocations/cm$^2$) | Density (B) of pairs of a pit and a diagonal line defect (pairs/cm$^2$) | B/A (%) |
|---|---|---|---|
| Sample 1 | 1447 | 1.3 | 0.09 |
| Sample 2 | 1933 | 1.1 | 0.06 |
| Sample 3 | 1635 | 0.9 | 0.06 |
| Sample 4 | 1500 | 1.7 | 0.11 |

The density (A) of screw dislocations in the single crystal silicon carbide substrate 10 was measured by etching, with KOH, the Si surface of the single crystal silicon carbide substrate 10 serving as the major surface 10A, and then inspecting the surface with an optical microscope to count the number. It may be noted that the single crystal silicon carbide substrate 10 for which the density (A) of screw dislocations was measured was not the substrate on which the silicon carbide epitaxial layer 11 was actually deposited, but was a substrate obtained by slicing the same ingot as that of the substrate on which the silicon carbide epitaxial layer 11 was deposited. This is because substrates obtained by slicing the same ingot have substantially the same density of screw dislocations in the single crystal silicon carbide substrate.

SICA6X (made by Lasertec Corporation) was used as a measuring device to measure the density (B) of pairs of a pit 112 and a diagonal line defect 111. The measurement mode was set to the DIC mode, and the magnification factor of the objective lens was set to 10 times for measurement. The silicon carbide epitaxial wafer 100 is 6 inches, and the pairs of a pit 112 and a diagonal line defect 111 were measured in the area excluding the area situated within 3 mm from the edge of the silicon carbide epitaxial wafer 100. To be more specific, a differential interference microscopic image was captured for each 1.78 mm×1.78 mm square on the surface 11A of the silicon carbide epitaxial layer 11 in the above-noted area. The captured differential interference microscopic images were automatically stitched together by a computer, and, then, the number of pairs of a pit 112 and a diagonal line defect 111 were counted for measurement.

With respect to the silicon carbide epitaxial wafer sample 1, the density (A) of screw dislocations in the single crystal silicon carbide substrate 10 was 1447 (dislocations/cm$^2$), and the density (B) of pairs of a pit 112 and a diagonal line defect 111 in the surface 11A of the silicon carbide epitaxial layer 11 was 1.3 (pairs/cm$^2$). Accordingly, the ratio (B/A) between the density (B) of pairs of a pit 112 and a diagonal line defect 111 in the surface 11A of the silicon carbide epitaxial layer 11 and the density (A) of screw dislocations in the single crystal silicon carbide substrate 10 was 0.09%.

With respect to the silicon carbide epitaxial wafer sample 2, the density (A) of screw dislocations in the single crystal silicon carbide substrate 10 was 1933 (dislocations/cm$^2$), and the density (B) of pairs of a pit 112 and a diagonal line defect 111 in the surface 11A of the silicon carbide epitaxial layer 11 was 1.1 (pairs/cm$^2$). Accordingly, the ratio (B/A) between the density (B) of pairs of a pit 112 and a diagonal line defect 111 in the surface 11A of the silicon carbide epitaxial layer 11 and the density (A) of screw dislocations in the single crystal silicon carbide substrate 10 was 0.06%.

With respect to the silicon carbide epitaxial wafer sample 3, the density (A) of screw dislocations in the single crystal silicon carbide substrate 10 was 1635 (dislocations/cm$^2$), and the density (B) of pairs of a pit 112 and a diagonal line defect 111 in the surface 11A of the silicon carbide epitaxial layer 11 was 0.9 (pairs/cm$^2$). Accordingly, the ratio (B/A) between the density (B) of pairs of a pit 112 and a diagonal line defect 111 in the surface 11A of the silicon carbide epitaxial layer 11 and the density (A) of screw dislocations in the single crystal silicon carbide substrate 10 was 0.06%.

With respect to the silicon carbide epitaxial wafer sample 4, the density (A) of screw dislocations in the single crystal silicon carbide substrate 10 was 1500 (dislocations/cm$^2$), and the density (B) of pairs of a pit 112 and a diagonal line defect 111 in the surface 11A of the silicon carbide epitaxial layer 11 was 1.7 (pairs/cm$^2$). Accordingly, the ratio (B/A)

between the density (B) of pairs of a pit 112 and a diagonal line defect 111 in the surface 11A of the silicon carbide epitaxial layer 11 and the density (A) of screw dislocations in the single crystal silicon carbide substrate 10 was 0.11%.

In the above-noted samples serving as examples, the ratio (B/A) between the density (B) of pairs of a pit 112 and a diagonal line defect 111 in the surface 11A of the silicon carbide epitaxial layer 11 and the density (A) of screw dislocations in the single crystal silicon carbide substrate 10 was greater than or equal to 0.06% and less than or equal to 0.11%.

Although one or more embodiments have heretofore been described, any particular embodiments are non-limiting, and various variations and modifications may be made without departing from the scopes defined by the claims. The scope of the present invention is not specified by the contents provided heretofore, but is specified by the claims. Any modifications representing and within the equivalent scope of the claims are intended within the scope of the present invention.

DESCRIPTION OF REFERENCE SYMBOLS 10 single crystal silicon carbide substrate
10A major surface
10B back surface
11 silicon carbide epitaxial layer
11A surface
100 silicon carbide epitaxial wafer
100A surface
101 long, narrow stacking fault
111 diagonal line defect
111a stacking fault
112 pit
112a screw dislocation
210 single crystal silicon carbide substrate serving as seed crystal
211 screw dislocation
220 single crystal silicon carbide
221, 222 screw dislocation
221a, 222a turning point
223, 224 long, narrow stacking fault
300 polishing apparatus
310 platen
311 body
312 rotating shaft
313 polishing cloth
320 holder
321 body
322 rotating shaft
323 hold face
330 polishing liquid feeder
400 deposition apparatus
401 chamber
403 induction heating coil
404 quartz tube
405 heat insulation material
406 heating element
407 substrate holder
408 rotating susceptor

The invention claimed is:

1. A silicon carbide epitaxial wafer, comprising:
a single crystal silicon carbide substrate of 4H polytype having a major surface thereof inclined at an angle θ to a {0001} plane toward a <11-20>direction,
a silicon carbide epitaxial layer of a thickness t formed on the major surface,
wherein a diameter of the single crystal silicon carbide substrate is greater than or equal to 150 mm,
wherein the angle θ exceeds 0°, and is less than or equal to 6°,
wherein one or more pairs of a screw dislocation pit and a diagonal an oblique line defect situated at a distance of t/tanθ from the pit are present in a surface of the silicon carbide epitaxial layer, and
wherein a density of the pairs of a pit and a diagonal line defect is less than or equal to 2 pairs/cm$^2$.

2. The silicon carbide epitaxial wafer as claimed in claim 1, wherein a line width of the diagonal line defect is greater than or equal to 1 μm and less than or equal to 5μm.

3. The silicon carbide epitaxial wafer as claimed in claim 1, wherein the diagonal line defect is situated on a side of the pit that forms a pair with the diagonal line defect, the side being in a direction in which the surface of the silicon carbide epitaxial layer and the {0001} plane of the silicon carbide epitaxial layer come closer to each other.

4. The silicon carbide epitaxial wafer as claimed in claim 2, wherein the diagonal line defect is situated on a side of the pit that forms a pair with the diagonal line defect, the side being in a direction in which the surface of the silicon carbide epitaxial layer and the {0001} plane of the silicon carbide epitaxial layer come closer to each other.

5. The silicon carbide epitaxial wafer as claimed in claim 1, wherein the density of the pairs of a pit and a diagonal line defect relative to a density of screw dislocations in the single crystal silicon carbide substrate is less than or equal to 0.11%.

6. A silicon carbide epitaxial wafer, comprising:
a single crystal silicon carbide substrate of 4H polytype having a major surface thereof inclined at an angle θ to a {0001} plane toward a <11-20>direction, and
a silicon carbide epitaxial layer of a thickness t formed on the major surface,
wherein a diameter of the single crystal silicon carbide substrate is greater than or equal to 150 mm,
wherein the angle θ exceeds 0°, and is less than or equal to 6°,
wherein one or more pairs of a screw dislocation pit and a diagonal an oblique line defect situated at a distance of t/tan θ from the pit are present in a surface of the silicon carbide epitaxial layer,
wherein a density of the pairs of a pit and a diagonal an oblique line defect is less than or equal to 2 pairs/cm$^2$,
wherein a line width of the diagonal oblique line defect is greater than or equal to 1 μm and less than or equal to 5 μm,
wherein the diagonal line defect is situated on a side of the pit that forms a pair with the diagonal line defect, the side being in a direction in which the surface of the silicon carbide epitaxial layer and the {0001} plane of the silicon carbide epitaxial layer come closer to each other, and
wherein the density of the pairs of a pit and a diagonal line defect relative to a density of screw dislocations in the single crystal silicon carbide substrate is less than or equal to 0.11%.

7. The silicon carbide epitaxial wafer as claimed in claim 2, wherein the density of the pairs of a pit and a diagonal line defect relative to a density of screw dislocations in the single crystal silicon carbide substrate is less than or equal to 0.11%.

8. The silicon carbide epitaxial wafer as claimed in claim 3, wherein the density of the pairs of a pit and a diagonal line defect relative to a density of screw dislocations in the single crystal silicon carbide substrate is less than or equal to 0.11%.

9. The silicon carbide epitaxial wafer as claimed in claim 4, wherein the density of the pairs of a pit and a diagonal line defect relative to a density of screw dislocations in the single crystal silicon carbide substrate is less than or equal to 0.11%.

* * * * *